(12) United States Patent
Kim et al.

(10) Patent No.: US 8,440,982 B1
(45) Date of Patent: May 14, 2013

(54) CRYO TRANSFER HOLDER FOR TRANSMISSION ELECTRON MICROSCOPE

(75) Inventors: Youn-Joong Kim, Daejeon (KR); Jong-Man Jeung, Daejeon (KR); Seok-Hoon Lee, Daejeon (KR)

(73) Assignee: Korea Basic Science Institute, Daejeon (KR)

( * ) Notice: Subject to any disclaimer, the term of this patent is extended or adjusted under 35 U.S.C. 154(b) by 0 days.

(21) Appl. No.: 13/329,781

(22) Filed: Dec. 19, 2011

(51) Int. Cl.
*H01J 37/20* (2006.01)
*G01N 35/10* (2006.01)

(52) U.S. Cl.
USPC ............. 250/442.11; 250/440.11; 250/441.11

(58) Field of Classification Search .................. 250/306, 250/307, 309–311, 440.11, 441.11, 442.11
See application file for complete search history.

(56) References Cited

U.S. PATENT DOCUMENTS

| | | | |
|---|---|---|---|
| 4,591,722 A | 5/1986 | Biddlecombe et al. | |
| 4,833,330 A * | 5/1989 | Swann et al. | 250/443.1 |
| 4,950,901 A * | 8/1990 | Jones et al. | 250/443.1 |
| 5,753,924 A | 5/1998 | Swann | |
| 6,410,925 B1 * | 6/2002 | Armbruster et al. | 250/442.11 |
| 7,989,778 B2 * | 8/2011 | Oetelaar et al. | 250/442.11 |
| 8,336,405 B2 * | 12/2012 | Stabacinskiene et al. | 73/864.91 |
| 2007/0023701 A1 * | 2/2007 | Fishione et al. | 250/492.21 |
| 2007/0252090 A1 * | 11/2007 | van de Water et al. | 250/429 |
| 2012/0024086 A1 * | 2/2012 | Stabacinskiene et al. | 73/864.91 |
| 2012/0273679 A1 * | 11/2012 | Bewick et al. | 250/310 |

FOREIGN PATENT DOCUMENTS

DE 69816974 T2 7/2004

OTHER PUBLICATIONS

Search Report by German Patent and Trademark Office for Korean Application No. 10-2012-209 6787, dated Feb. 6, 2013.

* cited by examiner

*Primary Examiner* — Nikita Wells
*Assistant Examiner* — Johnnie L Smith
(74) *Attorney, Agent, or Firm* — Edwards Wildman Palmer LLP

(57) ABSTRACT

The present invention relates to a cryo transfer holder for TEM including: a specimen support having a specimen rod with a specimen cradle provided on one side end thereof, while being airtightly inserted reciprocatingly on the other side end thereof into a cooling tube of a thermal insulating container, and a thermal insulating pipe configured to be fixed to the thermal insulating container on one side thereof and to surround the specimen rod except the specimen cradle at the time of observation. The thermal insulating container in which a cooling medium is contained has the cooling pipe penetrated thereinto. A specimen rod-reciprocating means is configured to be coupled to the side of the thermal insulating container to allow the specimen rod to be reciprocated relative to the thermal insulating container.

5 Claims, 8 Drawing Sheets

- Prior Art -

CRYO TRANSFER HOLDER FOR TRANSMISSION ELECTRON MICROSCOPE

BACKGROUND

1. Technical Field

The present invention relates to a cryo transfer holder for a transmission electron microscope (which is referred to as 'TEM') that is configured to prevent a cooled (biological) specimen from being thermally damaged when the specimen is observed by the TEM in a cooling process.

2. Related Art

A method for observing a (biological) specimen through a TEM includes a chemical fixing method and a cryo-method. The chemical fixing method is performed by introducing a chemical fixing liquid to a fine cell structure, fixing the cell structure, cutting it to a very thin slice, and observing the cut thin slice. According to the chemical fixing method, however, the speed of the introduction of the fixing liquid to the cells is relatively slow and the cells are deformed by the chemical fixing liquid, which makes it hard to observe the cell structure in its original shape.

On the other hand, the biological specimen is basically composed of substantially low atomic weight elements. If the biological specimen is not dyed, a degree of contrast obtained by scattering is very low. By the way, since electron scattering in ice is higher than that in liquid, the water in the frozen biological specimen containing water serves to increase the contrast thereof. Because the frozen biological specimen containing water is not influenced by the chemical fixation or additional dyeing process, also, the frozen specimen is very similar to the specimen in a natural state. Therefore, the cryo-TEM method has played an important role in the field of biology.

To observe the biological specimen by the cryo-TEM method, a given procedure is needed and it is as follows: firstly, the specimen is mixed with liquid (e.g., water, buffer and the like), is placed on a given pre-processed grid by means of a pipette, and is then dewatered by means of filter paper; secondly, the specimen grid is submerged into an ethane solution cooled to a liquid nitrogen temperature and is quickly cooled so as not to form ice crystals thereon; thirdly, the quickly cooled specimen grid is transferred from a workstation insulated vessel in which liquid nitrogen is contained to a specimen cradle provided on the end of a cryo transfer holder (which is referred simply as 'holder'). The above-mentioned processes are referred to as "specimen preparation step." Next, the holder is mounted on a column of the TEM and an image is obtained from the specimen.

In the mounting and observing steps on the column of the TEM after the completion of the specimen preparation step, if the temperature of the mounted specimen is changed or if the temperatures between the holder and the interior of the column of the TEM are different, crystalline ice is formed on the specimen to cause the specimen tissues to be destructed, thereby influencing the quality of the observation. To stably maintain the temperature of the holder (that is, the specimen cradle) therefore, the holder typically includes a specimen rod made of good thermal conductivity and has the specimen cradle provided on one side end thereof and a thermal insulating container (Dewar) having liquid nitrogen contained therein, through which the other side end of the specimen rod is passed and insertedly fixed thereto, as shown in FIG. 1. At this time, all of the specimen rod, except the specimen cradle, is embedded into a thermal insulating pipe made of a thermal insulating material. Generally, a heater or cooler, specimen cradle rotating means and the like can be mounted around the specimen cradle in accordance with the types or purposes of the holder. Under the above-mentioned structure of the holder, the cooled air of the liquid nitrogen is effectively transferred through the specimen rod to the specimen cradle, so that the cooled specimen can be maintained well at a low temperature.

On the other hand, if the holder is mounted on the column of the TEM, the specimen rod is minutely vibrated in every direction because of its long length, and if the minute vibration is maintained, the position of the specimen cradle will be varied continuously, thereby making it impossible to perform the observation through the TEM. To prevent the uncontrollable minute vibration from occurring, a contact protrusion part, which is made of a crystal material, is attached on the end of the specimen cradle side of the specimen rod, and a contact receiving part (not shown) is provided at the position corresponding to the contact protrusion part in the interior of the column of the to be brought into contact with the contact protrusion part when the holder is mounted on the column and thus to supportingly fix the specimen rod thereto (At this time, the contact receiving part is controlled in movement by means of a goniometer of the TEM, which is not related to the present invention, and therefore, the detailed structure and movement thereof will be not explained herein). That is, if the holder is mounted on the column of the TEM, the contact protrusion part of the holder is received into the contact receiving part of the column, thereby preventing the arbitrary minute vibration from occurring.

According to the conventional practice, the cryo transfer holder for the TEM is mounted on the column (At this time, the contact protrusion part of the holder is brought into contact with the contact receiving part of the column to prevent the holder from being arbitrarily vibrated) and the pressure reduction and additional cooling of the column are performed to reach predetermined internal pressure and temperature. Through these steps, an image can be observed. However, at the moment when the cryo transfer holder for the TEM is mounted on the column to permit the contact protrusion part of the holder to be brought into contact with the contact receiving part of the tube, the heat from the tube is at a higher temperature than the holder and is thus transmitted to the specimen cradle through the contact receiving part and the contact protrusion part, thereby undesirably causing the cooled specimen to be damaged by the heat transfer.

SUMMARY

Accordingly, the present invention has been made in view of the above-mentioned problems occurring in the prior art, and it is an object of the present invention to provide a cryo transfer holder for a TEM that is configured to allow a contact receiving part and a contact protrusion part to be brought into contact with each other after the holder is mounted on a column of the TEM and the column reaches given internal pressure and temperature, thereby preventing a cooled specimen from being damaged.

To accomplish the above object, according to the present invention, there is provided a cryo transfer holder for a TEM including: a specimen support having a specimen rod having a specimen cradle provided on one side end of the specimen rod where a contact protrusion part is formed, while being airtightly inserted reciprocatingly on the other side end of the specimen rod thereof into a cooling tube of a thermal insulating container, and a thermal insulating pipe made of a thermal insulating material and configured to be fixed to the thermal insulating container on one side thereof and to surround the entire specimen rod except the specimen cradle 11 at the time of observation. More specifically, the thermal insulating container is formed of a double container in which a cooling medium is contained and has the cooling pipe penetrated thereinto. A specimen rod-reciprocating means is configured to be coupled to the side of the thermal insulating container from which the other side end of the specimen rod is protruded to allow the specimen rod to be reciprocated relative to the thermal insulating container by means of an external force applied from a user.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION

Hereinafter, an explanation on a cryo transfer holder for a TEM according to the present invention will be in detail given with reference to the attached drawing.

Figure 1:
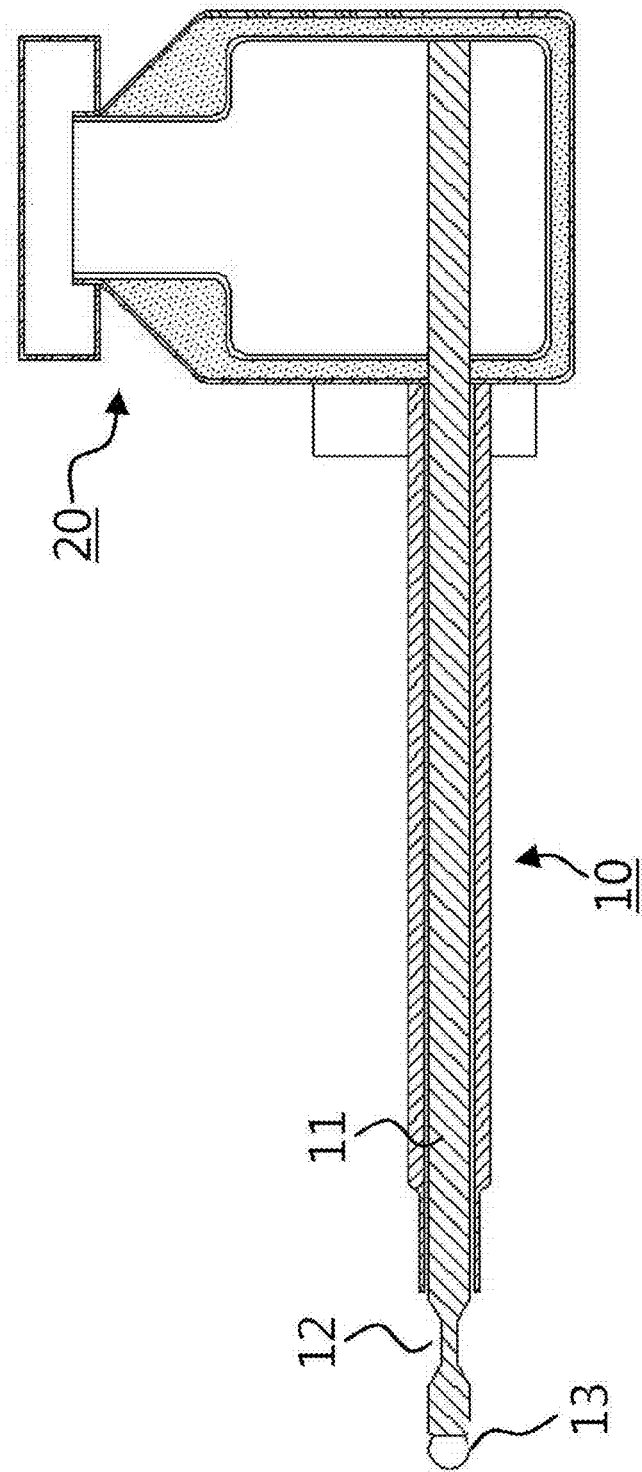
FIG. 1 is a conceptual sectional view showing a cryo transfer holder for a TEM in a conventional practice
Figure 2:
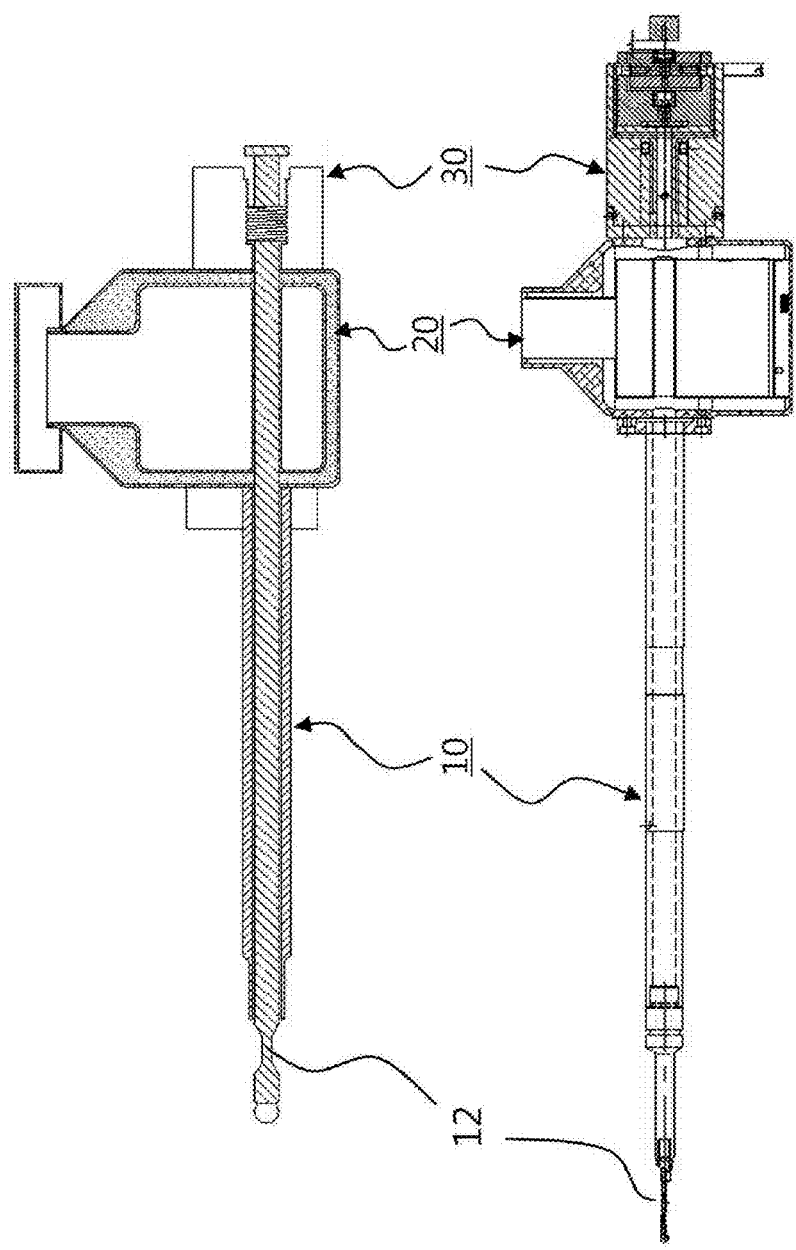
FIGS. 2 and 3 are design sectional views showing a cryo transfer holder for a TEM according to an exemplary embodiment of the present invention.
Figure 3:
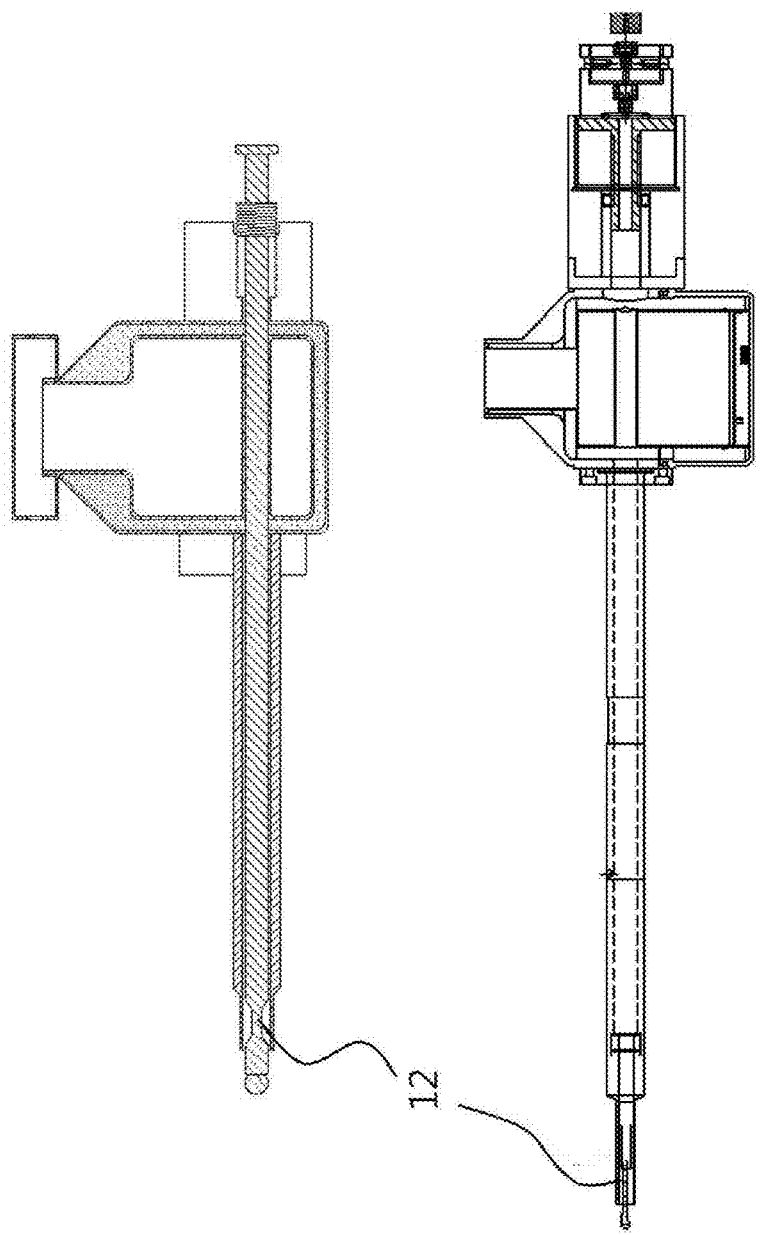

FIGS. 2 and 3 are sectional views showing a cryo transfer holder for a TEM according to the present invention.

According to the conventional practice, the specimen rod is introduced into the interior of the thermal insulating container 20 and is directly fixed thereto, but according to the present invention, the specimen rod is penetrated into the thermal insulating container 20 and is also reciprocated by a given distance (generally, a distance between about 1 cm and 3 cm). Therefore, the specimen rod is not in direct contact with the thermal insulating container 20 and is instead indirectly contacting the thermal insulating container 20 via a cooling pipe made of a material having excellent thermal conductivity.

A portion of the front stage (a specimen support 10) of the thermal insulating container 20 on the cryo transfer holder is mounted on the column of an electron microscope. Unlike the conventional cryo transfer holder having the specimen rod mounted at the inside of the column, the holder according to the present invention has the specimen rod penetrated partially into the thermal insulating container 20 to be positioned outside of the column Therefore, air leakage may occur through the contacted surface between the specimen and the thermal insulating container 20. To prevent the air leakage, airtightness should be provided between the specimen and the cooling pipe.

According to the present invention, the basic function (of maintaining the cooling state of the specimen) of the specimen support 10 and the thermal insulating container 20 is the same as in the conventional practice, and the function, material, size and coupling position of the thermal insulating pipe 13 according to the present invention are the same as those in the conventional holder. However, the specimen rod-reciprocating means 30 is unique, which is not provided in the conventional practice, and it is coupled to the side of the thermal insulating container 20 from which the other side end of the specimen rod is protruded so as to allow the specimen rod to be reciprocated precisely relative to the thermal insulating container 20 by means of an external force. That is, the specimen rod-reciprocating means 30 functions to push or pull the specimen rod on the opposite side to the specimen cradle 11. At this time, the specimen rod is reciprocated relative to the thermal insulating container 20, but it is not rotatable around the center shaft thereof. To prevent the specimen rod from rotating around the center shaft thereof, desirably, axial rotation prevention concave convex structures are formed between the specimen rod and the thermal insulating pipe 13 or between the specimen rod and the cooling pipe to correspond to each other in an axial direction thereof.

If the specimen rod is pushed through the specimen rod-reciprocating means 30 by the force applied by a user, the specimen cradle 11 region is pushed to the outside of the thermal insulating pipe 13, which makes the specimen cradle 11 positioned at an observing state (See FIG. 2). Contrarily, if the specimen rod is pulled, the specimen cradle 11 region is hidden into the thermal insulating pipe 13 (See FIG. 3). In the drawings, the upper parts show exemplary conceptual sectional views and the lower parts show the design sectional views.

According to the present invention, the specimen rod-reciprocating means 30 is a part having a function of reciprocating the specimen rod, while preventing the axial rotation of the specimen rod, which is applicable to a variety of means well known to the conventional practices.

For example, the specimen rod-reciprocating means 30 adopted in the present invention includes: a rotation-supporting part 31 configured to be coupled to the side of the thermal insulating container 20 from which the other side end of the specimen rod is protruded to receive the other side end of the protruded specimen rod and configured to be rotated cooperatively with a rotary part 32. In particular, the rotary part 32 is configured to be coupled to be rotated relative to the other side end of the specimen rod (which is not permitted to be rotated axially) to push or pull the specimen rod, while not rotating the specimen rod and configured to be rotated cooperatively with the rotation-supporting part 31. This example has a structure in which the rotation-supporting part 31 and the rotary part 32 are rotated cooperatively with each other. In this case, desirably, the rotation of the rotation-supporting part 31 and the rotary part 32 in cooperative relation with each other is achieved by providing a threaded bore and a screw correspondingly to each other on the contacted surface between the rotation-supporting part 31 and the rotary part 32. If the rotary part 32 is rotated in one direction, it moves to the thermal insulating container 20 and at the same time pushes the specimen rod coupled thereto, thereby allowing the specimen cradle 11 to be located in the observing state. Contrarily, if the rotary part 32 is rotated in the other side direction, it moves from the thermal insulating container 20 and at the same time pulls the specimen rod coupled thereto, thereby allowing the specimen cradle 11 to be hidden inside the thermal insulating pipe 13.

As another example, the specimen rod-reciprocating means 30 adopted in the present invention includes a rotation-supporting part 31 configured to be coupled to the side of the thermal insulating container 20 from which the other side end of the specimen rod is protruded. The rotation-supporting part 31 is also configured to receive the other side end of the protruded specimen rod and at the same time receive a rotary part 32 to rotate the rotary part 32 around its axis. The rotary part 32 is configured to be rotated cooperatively with the other side end of the specimen rod to be rotated relative to the other side end of the specimen rod (which is not permitted to be rotated axially). This example has a structure wherein the rotary part 32 and the other side end of the specimen rod are rotated cooperatively with each other. In this case, desirably, the rotation of the rotary part 32 and the other side end of the specimen rod in the cooperative relation with each other is achieved by providing a threaded bore and a screw correspondingly to each other on the contacted surface between the rotary part 32 and the other side end of the specimen rod. If the rotary part 32 is rotated in one direction or the other, it is rotated in place and pushes or pulls the specimen rod rotating cooperatively therewith. Accordingly, the specimen cradle 11 provided on the end of the specimen rod is exposed to the outside of the thermal insulating pipe 13 or hidden inside the thermal insulating pipe 13.

As yet another example, the specimen rod-reciprocating means 30 adopted in the present invention includes a rotation-supporting part 31 configured to be rotatably coupled in place to the side of the thermal insulating container 20 from which the other side end of the specimen rod is protruded and to receive the other side end of the protruded specimen rod therein to be rotated cooperatively with a rotary part 32. The rotary part 32 is configured to be fixedly coupled (not rotated axially) to the other side end of the specimen rod (which is not permitted to be rotated axially) to be rotated cooperatively with the rotation-supporting part 31.

In this embodiment, if the rotation-supporting part 31 is rotated in one direction or the other direction, the rotational motion used in place of the rotation-supporting part 31 is converted into the linear reciprocating motion of the rotary part 32 (and the specimen rod coupled to the rotary part 32) to push or pull the specimen rod, such that the specimen cradle 11 provided on the end of the specimen rod is exposed to the outside of the thermal insulating pipe 13 or hidden inside the thermal insulating pipe 13.

Figure 4:
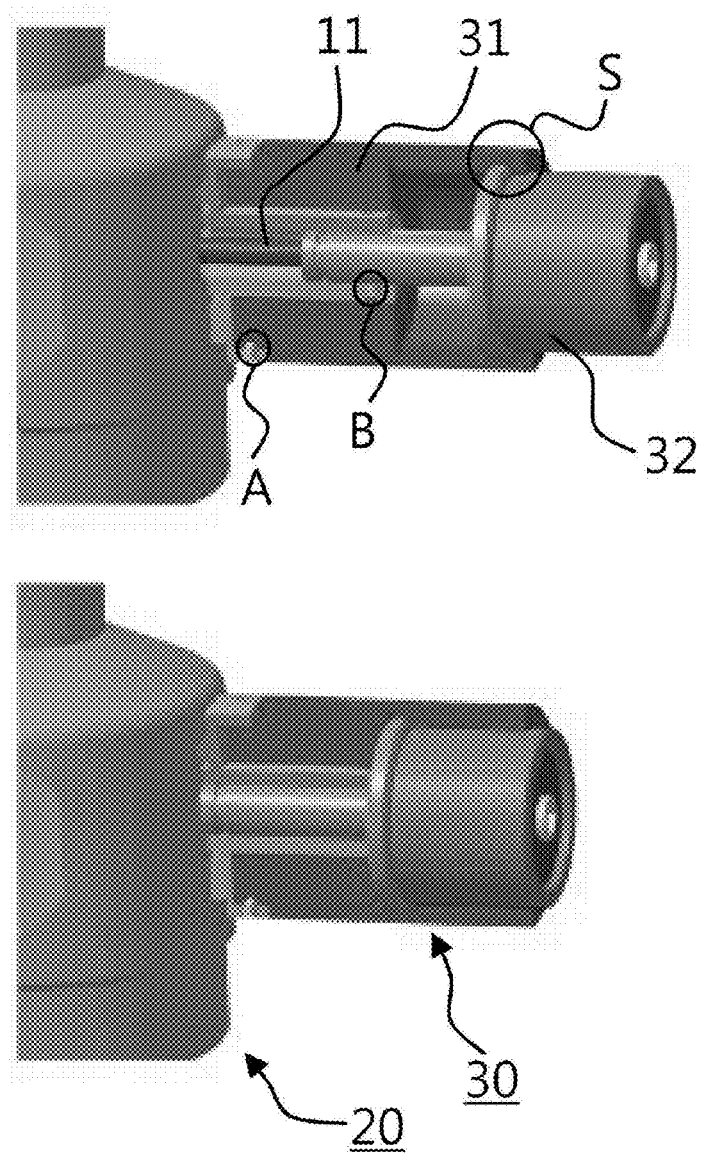
FIG. 4 shows a partial sectional view of the specimen rod-reciprocating means according to the exemplary embodiment of the present invention.
Figure 5:
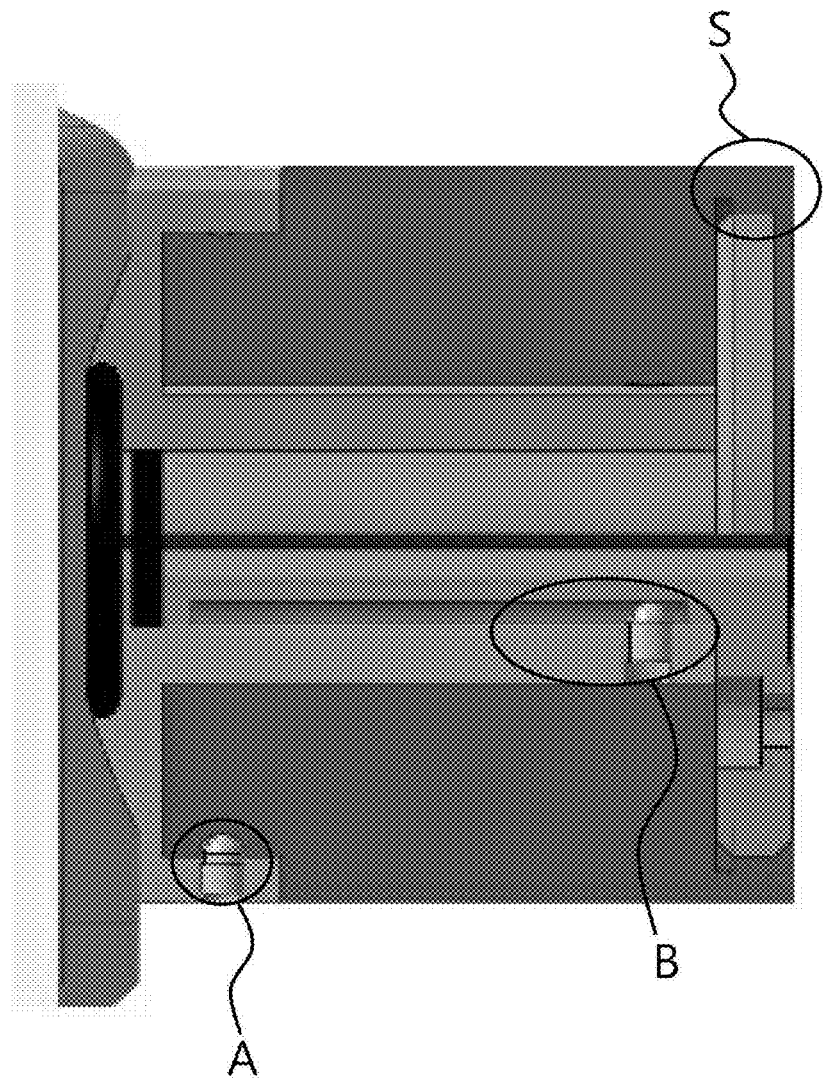
FIG. 5 shows a partial sectional view of the internal structure of the specimen rod-reciprocating means according to the exemplary embodiment of the present invention.

FIG. 4 shows a partial sectional view of the specimen rod-reciprocating means 30 in the state where the specimen cradle 11 is hidden inside the thermal insulating pipe 13 (on the upper side of the figure) and a partial sectional view of the specimen rod-reciprocating means 30 in the state where the specimen cradle 11 is exposed to the outside of the thermal insulating pipe 13 (on the lower side of the figure). FIG. 5 shows a partial sectional view of the internal structure of the specimen rod-reciprocating means 30. A sealing means like O-ring and typical control means for minutely controlling the angle or position of the specimen cradle 11 are not denoted herein. In the drawings, 'S' denotes a cooperative rotating portion (threaded bore), 'A' denotes a groove formed along the outer periphery of the rotation-supporting part 31 and a fixing pin provided on the thermal insulating container 20, such that the rotation-supporting part 31 is rotatably coupled in place to the thermal insulating container 20. 'B' denotes a groove formed axially along the rotary part 32 and a fixing pin provided on the thermal insulating container 20, so that the rotary part 32 is not permitted to be rotated axially and is linearly reciprocated.

Figure 6:
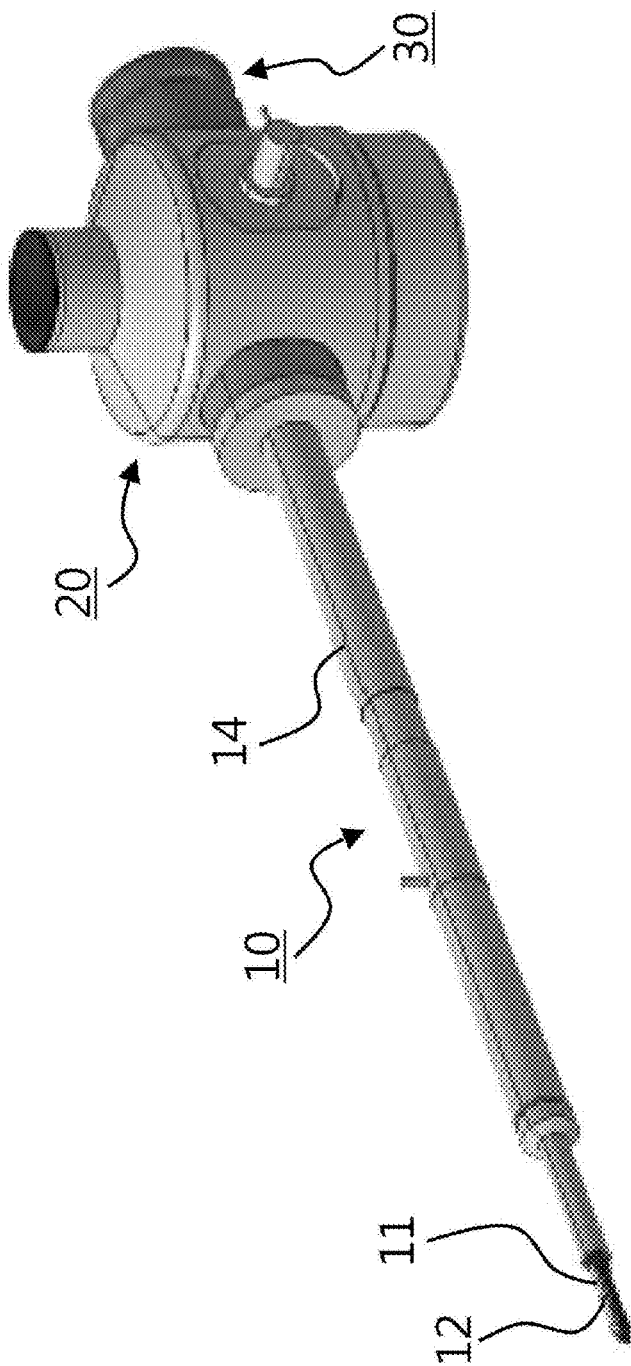
FIG. 6 is a conceptual perspective view showing the cryo transfer holder for a TEM according to the present invention.
Figure 7:
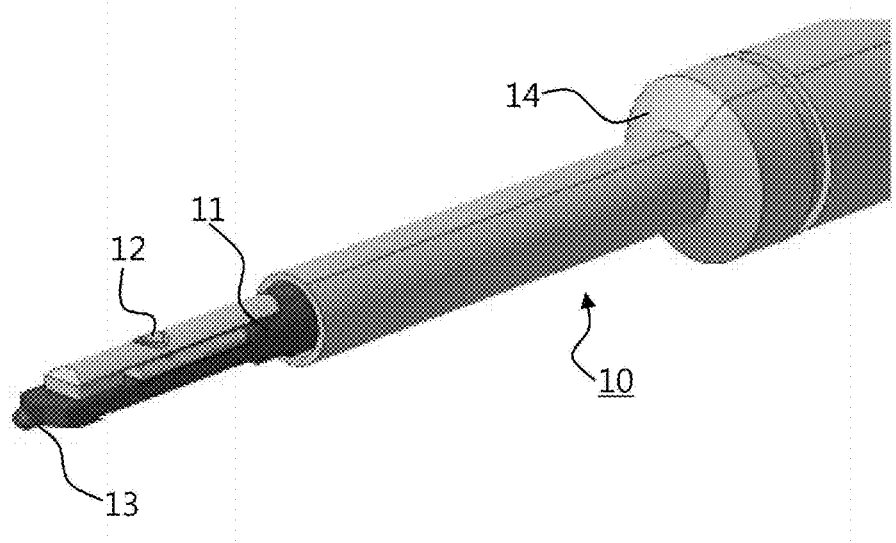
FIG. 7 is a partly perspective view showing an exposed state of a specimen cradle 11 in the cryo transfer holder for a TEM according to an exemplary embodiment of the present invention.
Figure 8:
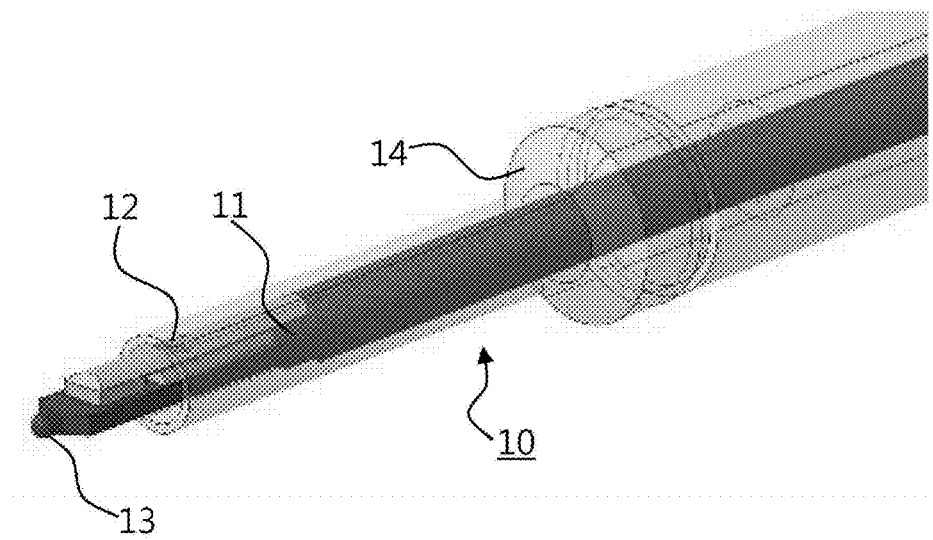
FIG. 8 is a partly transparent perspective view showing a state wherein the specimen cradle 11 in the cryo transfer holder for a TEM according to an exemplary embodiment the present invention is hidden into a thermal insulating pipe 13.

FIG. 6 is a conceptual perspective view showing the cryo transfer holder for a TEM according to the present invention, FIG. 7 is a partly perspective view showing an exposed state of a specimen cradle 11 in the cryo transfer holder for a TEM according to the present invention, and FIG. 8 is a partly transparent perspective view showing a state wherein the specimen cradle 11 in the cryo transfer holder for a TEM according to the present invention is hidden into the thermal insulating pipe 13.

The cryo transfer holder for a TEM according to the present invention can be used in the following manner.

First, liquid nitrogen is filled in the thermal insulating container 20, and if the specimen rod is cooled enough after it is placed for a predetermined period of time, the specimen cradle 11 is exposed to the outside of the thermal insulating pipe 13 by means of the specimen rod-reciprocating means 30. A cooled specimen (grid), previously prepared, is mounted on the specimen cradle 11, and then, the specimen cradle 11 is inserted into the thermal insulating pipe 13 by means of the specimen rod-reciprocating means 30. At this point, the cryo transfer holder is mounted on the column of the TEM in a typical manner (At this time, the specimen rod is located inside the thermal insulating pipe 13) and the interior of the tube is reduced in pressure and cooled. If the interior of the column reaches a predetermined temperature and pressure, the specimen cradle 11 is exposed to the outside of the thermal insulating pipe 13 by means of the specimen rod-reciprocating means 30 to allow the contact protrusion part 12 of the specimen rod to be brought into contact with the contact receiving part of the column. In a typical manner, the TEM observation is performed.

As described above, there is provided the cryo transfer holder for a TEM according to the present invention that is capable of avoiding the contact of the contact receiving part of the column with the contact protrusion part 12 of the specimen rod at the time of mounting the cryo transfer holder on the column of the TEM, unlike the conventional practice, so that the thermal damage of the cooled specimen can be prevented to enhance the TEM observation efficiencies.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A cryo transfer holder for TEM comprising:
   a specimen support having
      a specimen rod with a specimen cradle provided on one side end of the specimen rod where a contact protrusion part is formed, while being airtightly inserted reciprocatingly on the other side end of the specimen rod into a cooling tube of a thermal insulating container, and
      a thermal insulating pipe made of a thermal insulating material and configured to be fixed to the thermal insulating container on one side thereof, the thermal insulating pipe configured to surround the specimen rod except the specimen cradle at the time of observation;
   wherein the thermal insulating container is formed of a double container in which a cooling medium is contained and has the cooling pipe penetrated thereinto; and
   a specimen rod-reciprocating means configured to be coupled to the side of the thermal insulating container from which the other side end of the specimen rod is protruded to allow the specimen rod to be reciprocated relative to the thermal insulating container by means of an external force applied by a user.

2. The cryo transfer holder for a TEM according to claim 1, wherein the specimen rod-reciprocating means comprises:
a rotation-supporting part coupled to the side of the thermal insulating container from which the other side end of the specimen rod is protruded to receive the other side end of the protruded specimen rod and configured to be rotated cooperatively with a rotary part,
wherein the rotary part is configured to be coupled to be rotated relative to the other side end of the specimen rod to rotate cooperatively with the rotation-supporting part.

3. The cryo transfer holder for a TEM according to claim 1, wherein the specimen rod-reciprocating means comprises:
a rotation-supporting part configured to be coupled to the side of the thermal insulating container from which the other side end of the specimen rod is protruded and to receive the other side end of the protruded specimen rod and at the same time to receive a rotary part in such a manner as to rotate the rotary part in place; and the rotary part configured to be rotated cooperatively with the other side end of the specimen rod in such a manner as to be rotated relative to the other side end of the specimen rod.

4. The cryo transfer holder for a TEM according to claim 1, wherein the specimen rod-reciprocating means comprises:
rotation-supporting part rotatably coupled in place to the side of the thermal insulating container from which the other side end of the specimen rod is protruded and is configured to receive the other side end of the protruded specimen rod therein to be rotated cooperatively with a rotary part,
wherein the rotary part is configured to be fixedly coupled to the other side end of the specimen rod to be rotated cooperatively with the rotation-supporting part.

5. A method comprising: filling a cooling liquid into a thermal insulating container; inserting a specimen cradle attached to one end of a specimen rod into the thermal insulating pipe by means of a specimen rod-reciprocating means reducing, by a cryo transfer holder, the pressure and temperature of the interior of a cooling tube; and once the interior of the cooling tube has reached a predetermined temperature and pressure, exposing the specimen cradle to the outside of the thermal insulating pipe using the specimen rod-reciprocating means to allow a contact protrusion part of the specimen rod to be brought into contact with a contact receiving part of a column the said specimen rod-reciprocating means configured to be coupled to the side of the thermal insulating container from which the other side end of the specimen rod is protruded to allow the specimen rod to be reciprocated relative to the thermal insulating container by means of an external force applied by a user.

* * * * *